United States Patent
Sudo

(10) Patent No.: US 7,592,653 B2
(45) Date of Patent: Sep. 22, 2009

(54) STRESS RELAXATION FOR TOP OF TRANSISTOR GATE

(75) Inventor: Gaku Sudo, Yokohama (JP)

(73) Assignee: Toshiba America Electronic Components, Inc., Irvine, CA (US)

( * ) Notice: Subject to any disclaimer, the term of this patent is extended or adjusted under 35 U.S.C. 154(b) by 59 days.

(21) Appl. No.: 11/409,090

(22) Filed: Apr. 24, 2006

(65) Prior Publication Data

US 2007/0246741 A1 Oct. 25, 2007

(51) Int. Cl.
*H01L 29/80* (2006.01)
(52) U.S. Cl. .............. 257/285; 257/269; 257/327; 257/18; 257/E29.226
(58) Field of Classification Search ........... 257/285, 257/E29.226, 269, 327, 18
See application file for complete search history.

(56) References Cited

U.S. PATENT DOCUMENTS 5,064,773 A * 11/1991 Feist ................ 438/234

2006/0125028 A1 * 6/2006 Chen et al. .......... 257/410
2006/0246672 A1 * 11/2006 Chen et al. .......... 438/301

OTHER PUBLICATIONS

T. Ghani, et al., "A 90nm High Volume Manufacturing Logic Technology Featuring Novel 45nm Gate Length Strained Silicon CMOS Transistors," IEEE 2003, 3 pages.
A. Shimizu, et al., "Local Mechanical-Stress Control (LMC): A New Technique for CMOS-Performance Enhancement," IEEE 2001, 4 pages.

* cited by examiner

*Primary Examiner*—Tu-Tu V Ho
(74) *Attorney, Agent, or Firm*—Banner & Witcoff, Ltd.

(57) ABSTRACT

An improved way to apply tensile or compressive stress to one or more transistors on a semiconductor device is described. A portion of the tensile or compressive stress liner may be removed or modified such that a reduced amount of stress, or even no stress, is applied above the transistor gate. This may cause edges of the stress liner to be adjacent to and on either side of the channel, thus, increasing the stress effect. To produce this stress liner structure, the stress liner may be applied and then a portion of the stress liner is modified to reduce the stress in that portion, such as through ion implantation. The stress liner portion may be modified to have a reduced stress by, for example, implanting certain ions such as germanium or xenon ions therein.

4 Claims, 2 Drawing Sheets

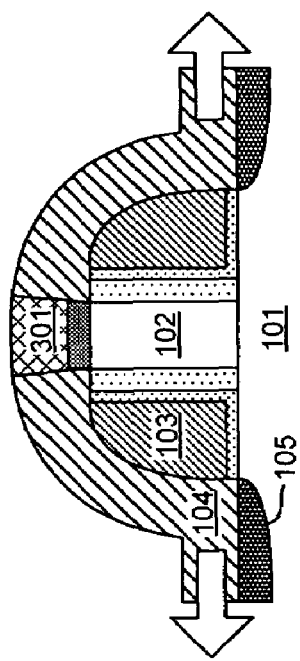
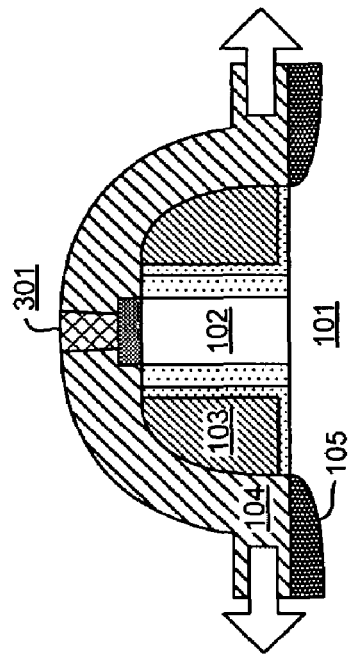

STRESS RELAXATION FOR TOP OF TRANSISTOR GATE

BACKGROUND

Stress liners are commonly used to enhance the performance of field-effect transistors (FETs). These stress liners may be used to provide either compressive or tensile stress on the transistor channel. For instance, a silicon nitride (SiN) compressive stress liner is often formed over a P type FET (PFET), and a tensile stress liner is often formed over an N type FET (NFET) such as shown in FIG. 1. Here, a gate 102 (e.g., polysilicon or another conductive material) is disposed over a silicon layer 101. Silicon layer 101 may be a simple silicon layer substrate or it may be part of a larger substrate structure such as a silicon-on-insulator (SOI) structure. Source/drain regions 105 are embedded in silicon layer 101, and sidewall spacers 103 are dispose on opposing sides of gate 102. A tensile SiN stress liner 104 is disposed over silicon layer 101, as well as completely over sidewall spacers 103 and gate 102.

As indicated by the arrows in FIG. 1, the tension provided by tensile stress liner 104 is distributed so as to provide sub-optimal tension where greater tension would otherwise be more effective. Thus, tensile stress liner 104 somewhat works against itself in providing tensile stress to the channel of the illustrated transistor. This is even more so where gate 102 is relatively short.

SUMMARY

Accordingly, an improved way to more efficiently apply tensile or compressive stress, as appropriate, to one or more transistors on a semiconductor device is needed. In turn, this improved stress may improve transistor performance.

As will be described in more detail, a portion of the tensile or compressive stress liner may be removed or modified such that a reduced amount of stress, or even no stress, is applied above the transistor gate. This may cause edges of the stress liner to be adjacent to and on either side of the channel and the stress to be concentrated on the edges, thus increasing the stress effect the transistor.

To produce this stress liner structure, the stress liner may be applied in a blanket fashion over the transistor, and then a portion of the stress liner over the gate is removed and possibly replaced with another material. Or, after applying the blanket stress liner over the transistor, a portion of the stress liner over the gate is modified to reduce the stress in that portion. The stress liner portion may be modified to have a reduced stress by, for example, implanting certain ions such as germanium or xenon ions therein.

The increased stress effects of providing the relaxed portion over the gate may be even more effective with shorter gates. Thus, as scales become smaller and gates become shorter in future technologies, it may be expected that top-of-gate stress reduction may become even more useful.

These and other aspects of the disclosure will be apparent upon consideration of the following detailed description of illustrative embodiments.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein:

FIG. 6 is a cross-sectional view of an illustrative semiconductor device portion showing a relaxed region that is substantially co-extensive with the width of the transistor gate.

FIG. 7 is a cross-sectional view of an illustrative semiconductor device portion showing a relaxed region that is smaller than the width of the transistor gate.

DETAILED DESCRIPTION OF ILLUSTRATIVE EMBODIMENTS

Figure 2:
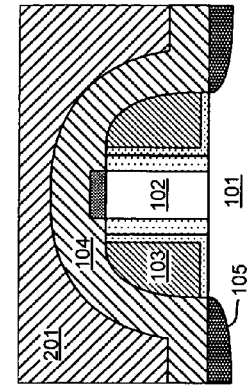
FIGS. 2-4 are each cross-sectional views of a semiconductor device portion during various manufacturing steps.
Figure 4:
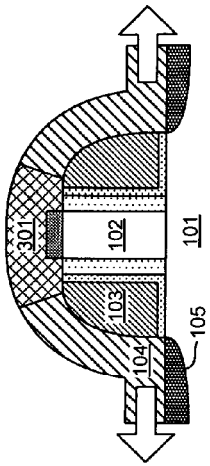
Figure 3:
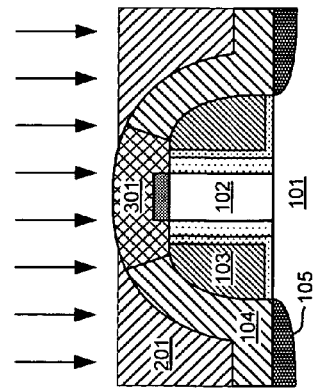

FIGS. 2-4 are each cross-sectional views of a semiconductor device portion during various manufacturing steps. By following these manufacturing steps as part of a larger manufacturing process, a semiconductor device may be produced with at least one transistor having a stress-reduced liner disposed over the transistor gate.

Referring to FIG. 2, stress liner 104 may be applied over silicon layer 101, such as in a conventional manner. In this example, stress liner 104 is a tensile stress liner, such as a tensile SiN layer or another material. However, stress liner 104 may alternatively be a compressive stress liner (which also may be SiN or another material). Stress liner 104 may be applied as a blanket layer over the entire semiconductor wafer and then patterned and etched using, for example, conventional resist (using photo resist layer 201 or an oxide layer), lithography, and etching techniques.

Before, during, or after the patterning of resist layer 201, resist layer 201 may be reduced in thickness at least in an area over gate 102. This may be accomplished by performing reactive ion etching (RIE) and/or chemical-mechanical polishing (CMP). Alternatively, and especially where an oxide layer is used instead of a photo resist layer as layer 201, during such lithography patterning and etching, the lithographical template may be configured so as to produce an opening in resist layer 201 over gate 102. In either case, the desired result is that a portion of stress liner 104 over gate 102 is exposed such that it is not covered by resist layer 201. The remainder of the transistor may remain covered by resist layer 201.

Next, referring to FIG. 3, the semiconductor wafer may be exposed to ion implantation to produce an implanted portion 301 of stress liner 104. The species of ions implanted into implanted portion 301 may include germanium or xenon ions. Because implanted portion 301 over gate 102 is exposed but the remainder of the transistor is not (as it is covered by resist layer 102), the only portion of stress liner 104 over the transistor that is implanted with ions during this step is implanted portion 301.

The implantation may cause implanted portion 301 to relax the amount and/or type of stress previously applied by that portion. Thus, the stress that was previously induced by implanted portion 301 is either reduced, completely removed, or reversed. For instance, where the stress is at a given level, implantation may reduce the stress by half or by even a greater reduction. Or, the stress may be completely neutralized such that no stress is applied by the implanted portion 301.

The ion implanting step as shown in FIG. 3 may be performed at any appropriate time during the semiconductor device manufacturing process. For example, the implanting step may be performed prior to the forming of an overlying inter-layer dielectric (ILD) layer and vertical conductive interconnect plugs.

As an alternative to implantation, resist layer 201 may be further reduced in height such that a portion of stress liner 104 is removed (e.g., by CMP). In this case, the removed portion may be replaced with a non-stress producing material.

As shown in FIG. 4, the result of relaxing stress liner 104 over gate 102 may be that the total stress applied by stress liner 104 is increased, thereby increasing the performance of the transistor. The increased stress (which in this example is tensile stress) is indicated by the relatively larger arrows in FIG. 4. This technique may be used for either tensile or compressive stress liners, as well as for dual-stress liners. For instance, where both an NFET and a PFET are used for complementary logic in a semiconductor device, the NFET may have a tensile stress liner with a relaxed portion over the NFET gate, and the PFET may have a compressive stress liner with a relaxed portion over the PFET gate.

Figure 5:
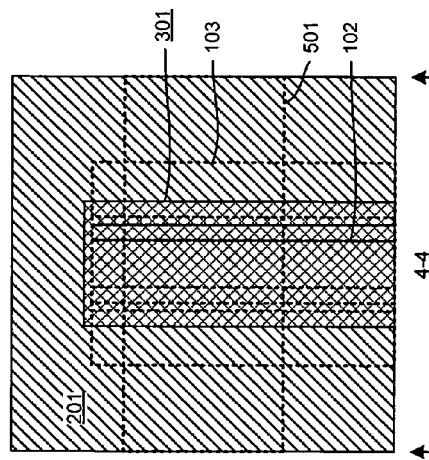
FIG. 5 is a plan view (view 5-5) of the semiconductor device portion of FIG. 4.
Figure 1:
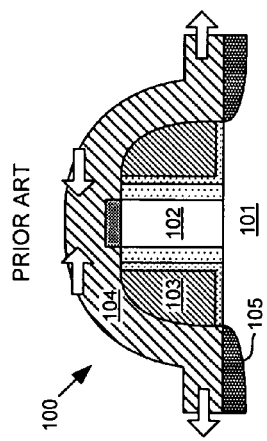
FIG. 1 is a side cross-sectional view of a semiconductor device portion with a conventional stress liner disposed completely over a transistor gate.

FIG. 5 shows an overhead plan view of the semiconductor device portion of FIG. 4. In this example, gate 102 may extend from the active area 501 of the transistor shown in FIG. 4 to a complementary adjacent transistor (not shown). It can be seen in this example that implanted portion 301 may completely cover gate 102 in the transistor active area 501. In this example, implanted portion 301 also at least partially covers sidewall spacers 103. Alternatively, implanted portion 301 may be substantially co-extensive with gate 102 in the active area 501 (such as shown in FIG. 6) or may only partially cover gate 102 in the active area 501 (such as shown in FIG. 7). Although implanted portion 301 is shown in FIG. 5 as having a rectangular shape, it may have any shape.

Thus, an improved way to more efficiently apply tensile or compressive stress to a transistor has been described, which may produce a higher performance transistor.

What is claimed is:

1. A semiconductor device, comprising:
   a silicon layer including a transistor active area including transistor source and drain regions;
   a polysilicon layer disposed on the silicon layer, the polysilicon layer disposed over the active area;
   a SiN stress-inducing layer disposed over the active area except for over the polysilicon layer; and
   a SiN layer doped with germanium, disposed on the portion of the polysilicon layer that is not covered by the stress-inducing layer, wherein the SiN layer doped with germanium has a width that is substantially co-extensive with a width of the polysilicon layer.

2. The semiconductor device of claim 1, wherein the stress-inducing layer is a compressive stress layer.

3. The semiconductor device of claim 1, wherein the stress-inducing layer is a tensile stress layer.

4. The semiconductor device of claim 1, further including a pair of insulating sidewall spacers disposed on opposing sides of the polysilicon layer, wherein the stress-inducing layer is disposed over the active area except for over the polysilicon layer and except for over a portion of each of the sidewall spacers.

* * * * *

UNITED STATES PATENT AND TRADEMARK OFFICE
CERTIFICATE OF CORRECTION

PATENT NO. : 7,592,653 B2  Page 1 of 1
APPLICATION NO. : 11/409090
DATED : September 22, 2009
INVENTOR(S) : Sudo It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 266 days.

Signed and Sealed this

Nineteenth Day of October, 2010

David J. Kappos
*Director of the United States Patent and Trademark Office*